United States Patent [19]

Toshiro et al.

[11] Patent Number: 5,021,694

[45] Date of Patent: Jun. 4, 1991

[54] CIRCUIT FOR DRIVING A GATED P-N-P-N DEVICE

[75] Inventors: Yoshiharu Toshiro; Kenichi Kasahara, both of Tokyo, Japan

[73] Assignee: NEC Corporation, Tokyo, Japan

[21] Appl. No.: 175,429

[22] Filed: Mar. 30, 1988

[30] Foreign Application Priority Data

Mar. 30, 1987 [JP] Japan .................................. 62-78087
Jul. 8, 1987 [JP] Japan .................................. 62-171526
Jul. 24, 1987 [JP] Japan .................................. 62-185926
Sep. 10, 1987 [JP] Japan .................................. 62-227634

[51] Int. Cl.⁵ .......................................... H03K 17/72
[52] U.S. Cl. .................................... 307/631; 307/634; 307/637
[58] Field of Search ............... 307/630, 631, 633, 634, 307/637, 642, 643, 305, 324; 357/16, 17, 38

[56] References Cited

U.S. PATENT DOCUMENTS 3,488,522  1/1970  Cameron et al. ................. 307/637
3,514,636  5/1970  Farrall ............................ 307/645

OTHER PUBLICATIONS

E. D. Wolley, "Gate Turn-Off in p-n-p-n Devices", IEEE Transactions on Electron Devices, vol. ED-13, No. 7, Jul. 1966, pp. 590-597.

Primary Examiner—John Zazworsky
Attorney, Agent, or Firm—Sughrue, Mion, Zinn, Macpeak & Seas

[57] ABSTRACT

A circuit for driving a gated p-n-p-n device comprises a p and/or n-gate electrodes provided on a p and/or n-gate regions of a p-n-p-n device, and a rectifying device provided between the p or n-gate electrode provided on a gate region which is higher in its impurity density than the other gate region and an anode or cathode electrode of the p-n-p-n device and/or a resistance means provided between the p or n-gate electrode provided on a gate region which is lower in its impurity density than the other gate region. In the circuit for driving a gated p-n-p-n device, excess carriers are expelled from the p and/or n-gate electrodes through the rectifying device and/or resistance means to the external of the p and/or n-gate regions.

2 Claims, 4 Drawing Sheets

CIRCUIT FOR DRIVING A GATED P-N-P-N DEVICE

FIELD OF THE INVENTION

The invention relates to a circuit for driving a gated p-n-p-n device, and more particularly to a circuit for driving a gated p-n-p-n device in which excess carriers are rapidly expelled from the gated p-n-p-n device.

BACKGROUND OF THE INVENTION

A silicon semiconductor device having p-n-p-n junctions has been known as a device for controlling a power etc. Much attention has been paid these days to a device having p-n-p-n junctions, which is made by III-V compound semiconductor, InP/InGaAsP or GaAs/AlGaAs, etc. because the device has functions of an optical switch, optical memory and wavelength conversion so that the device can be applied to fields of an optical computer, optical switching apparatus and optic-electric integrated circuit. Such a p-n-p-n device has been described, for instance, on pages 338 to 340 of "Appld. Phys. Lett. Vol. 50 (2), 1987" by G. W. Taylor et al. The p-n-p-n device is considered to be a device comprising two transistors in which collectors and bases are jointed to each other. For this structure, the p-n-p-n device is turned on in accordance with a positive feedback effect of transistors based on electric current which is produced by a light or electric trigger when a voltage applied to the p-n-p-n device is increased. In the turning-on state of the p-n-p-n device, all of the three p-n junctions are biased in a forward direction. Under such a condition, a band structure of the p-n-p-n device is the same as that of a semiconductor laser device or light emitting diode so that light is emitted from the p-n-p-n device. For the turning off of the p-n-p-n device, it has to be rapidly turned off. For this purpose, excess carriers must be expelled from the three p-n junctions which are forward-biased, or recombined therein.

A conventional circuit for driving a gated p-n-p-n device in which excess carriers are expelled from the gated p-n-p-n device has been described on pages 590 to 597 of "IEEE TRANSACTIONS ON ELECTRON DEVICES, Vol. ED-13, No. 7, July 1966". The conventional circuit for driving a gated p-n-p-n device comprises a power source for applying a predetermined polarity and level of a voltage through a serial resistance across anode and cathode electrode of the p-n-p-n device, and a gate circuit including a gate power source, a gate switch, and a gate resistance provided in series between the cathode electrode and a gate electrode of the p-n-p-n device.

In operation, when a positive voltage applied to the anode electrode of the p-n-p-n device is increased from the power source in a case where the gate switch is turned off, the p-n-p-n device is turned on. On the contrary, in a case where the gate switch is turned on at a predetermined timing when a negative voltage is applied to the anode electrode of the p-n-p-n device from the power source, holes accumulated in a p-layer to which the gate electrode is connected are expelled therefrom in accordance with an electric field induced by the gate power source. As a result, electrons accumulated in an n layer which is sandwiched between two p-layers of the p-n-p-n device are also expelled therefrom. Consequently, the gated p-n-p-n device is turned off faster than a p-n-p-n device having no gate circuit.

According to the conventional circuit for driving a gated p-n-p-n device, however, the gate circuit including the gate power source, gate switch and gate resistance must be provided therein, and the gate switch must be turned on and off at a predetermined timing. For these reasons, the construction of the circuit becomes complicated, and the cost for fabricating the circuit becomes higher.

SUMMARY OF THE INVENTION

Accordingly, it is an object of the invention is to provide a circuit for driving a gated p-n-p-n device in which there is no necessity of providing a gate switch to be turned on and off at a predetermined timing.

It is another object of the invention to provide a circuit for driving a gated p-n-p-n device in which the construction of the circuit becomes simplified thereby reducing the fabricating cost thereof.

According to one feature of the invention, a circuit for driving a gated p-n-p-n device comprises, a p-n-p-n device in which an impurity density of semiconductor layer for a p-gate region is higher than that of a semiconductor layer for an n-gate region, an anode and cathode electrodes respectively provided on an anode and cathode regions of said p-n-p-n device, a p-gate electrode provided on said p-gate region of said p-n-p-n device, a power source means for driving said p-n-p-n device, said power source means being provided in series between said anode and cathode electrodes, and means having a rectifying property which is provided between said p-gate electrode and said anode electrode, an anode electrode of said means being connected to said p-gate electrode.

BRIEF DESCRIPTION OF THE DRAWINGS

The invention will be explained in more detail in accordance with following drawings wherein.

DESCRIPTION OF THE PREFERRED EMBODIMENTS

Before explaining a circuit for driving a p-n-p-n device in an embodiment according to the invention, the aforementioned conventional circuit for driving a p-n-p-n device will be explained.

Figure 1:
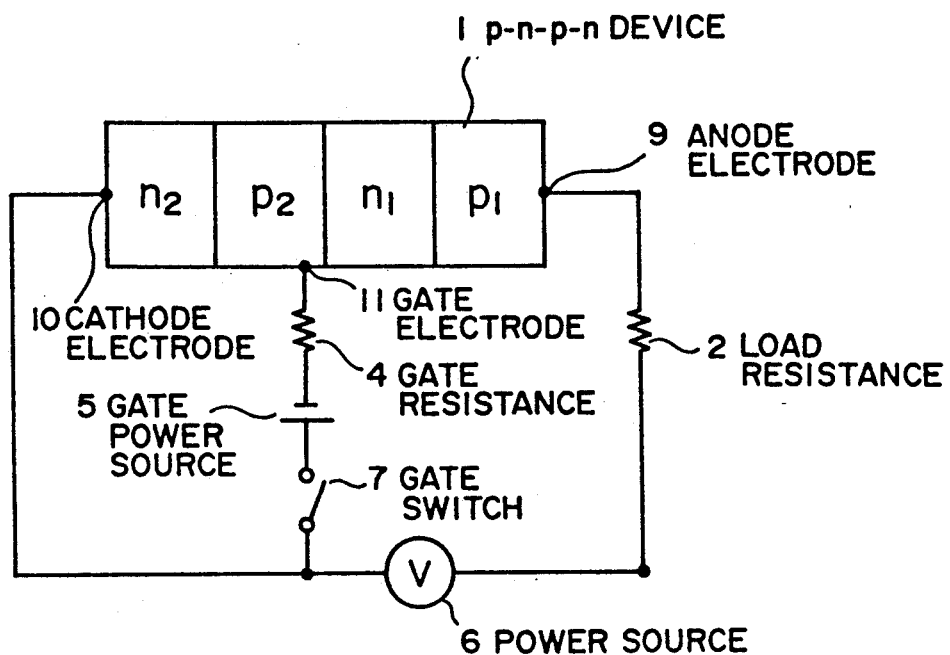
FIG. 1 is a circuit diagram showing a conventional circuit for driving a p-n-p-n device.

In FIG. 1, the p-n-p-n device 1 is shown to comprise first and second p-layers $p_1$ and $p_2$, a first and second n-layers $n_1$ and $n_2$, an anode electrode 9 provided on the first p-layer $p_1$, a cathode electrode 10 provided on the back surface of the second n-layer $n_2$, and a gate electrode 11 provided on the second p-layer $p_2$, and the circuit for driving the p-n-p-n device 1 is shown to comprise a power source 6 for applying a predetermined polarity and level of a voltage through a serial resistance 2 across the anode and cathode electrodes 9 and 10, and a gate circuit including a gate resistance 4, a gate power source 5, and a gate switch 7 provided in series between the gate and cathode electrodes 11 and 10.

In operation, when a positive voltage is applied from the power source 6 to the anode electrode 9 of the p-n-p-n device 1 and is increased up to a predetermined level under the condition that the gate switch 7 is turned off, the p-n-p-n device 1 is turned on. In a case where the gate switch 7 is turned on at a predetermined timing when a negative voltage is applied from the power source 6 to the anode electrode 9 of the p-n-p-n device 1, on the other hand, holes accumulated in the second p-layer $p_2$ of the p-n-p-n device 1 are expelled therefrom in accordance with an electric field induced by the gate power source 5. In accordance with the expulsion of the holes from the second p-layer $p_2$, electrons accumulated in the first n-layer $n_1$ are also expelled therefrom. As a result, the p-n-p-n device 1 is rapidly turned off.

Figure 2:
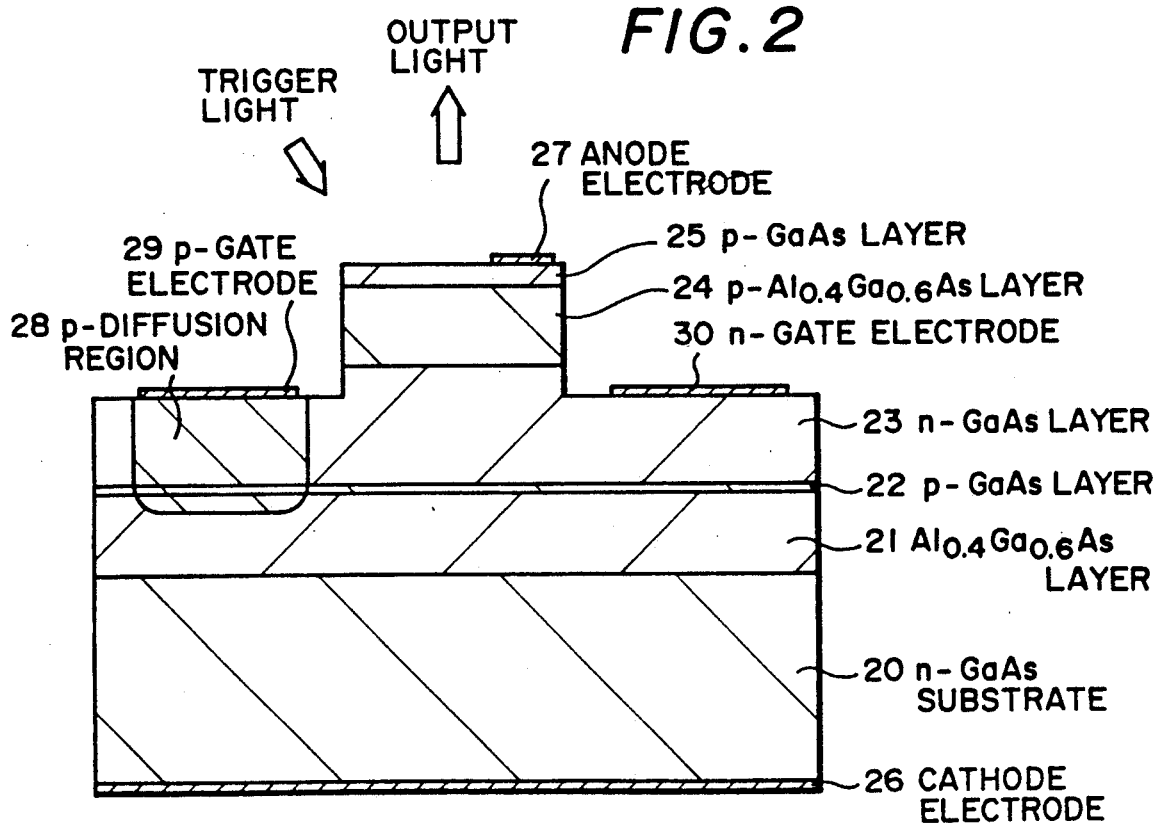
FIG. 2 is a cross sectional view showing a p-n-p-n device which is driven by a circuit for driving a p-n-p-n device according to the invention.

In FIG. 2, there is shown a gated p-n-p-n device to which a circuit for driving a gated p-n-p-n device according to the invention is applied as will be described later. The gated p-n-p-n device comprises a p-n-p-n structure as a basic structure, wherein a gate electrode is provided on each of a p-gate region and an n-gate region. One type of an applied structure is a pnn structure, wherein a p-gate region is depleted. In the case of p-n-p-n device, the gates structure and operation are the same to original pnpn device. In the gated p-n-p-n device, a cathode region comprises an n-GaAs substrate 20, and an n-$Al_{0.4}Ga_{0.6}As$ layer 21 having a thickness of 1 $\mu$m and an impurity density of $1 \times 10^{18}$ cm$^{-3}$, a p-gate region comprises a $P^+$-GaAs layer 22 having a thickness of 50 Å and an impurity density of $1 \times 10^{19}$ cm$^{-3}$, an n-gate region comprises an active layer of an n-GaAs layer 23 having a thickness of 1.0 $\mu$m and an impurity density of $1 \times 10^{17}$ cm$^{-3}$, and an anode region comprises a p-$Al_{0.4}Ga_{0.6}As$ layer 24 having a thickness of 0.5 $\mu$m, and an impurity density of $1 \times 10^{18}$ cm$^{-3}$. The gated p-n-p-n devices further comprises a contact layer of a $p^+$-GaAs layer 25 having a thickness of 0.15 $\mu$m and an impurity density of $1 \times 10^{19}$ cm$^{-3}$, a cathode electrode 26 of AuGe-Ni, an anode electrode 27 of Au/Cr/AuZn, a p-diffusion region 28, a p-gate electrode 29 of Au/Cr/AuZn, and an n-gate electrode 30 of AuGe-Ni.

The gated p-n p-n device as described above is fabricated as follows. At first, a wafer having a structure of the layers as shown in FIG. 2 is prepared. Secondly, the n-GaAs layer 23 is etched selectively in the wafer to be removed in its thickness by 0.2 $\mu$m and is diffused selectively with Zn by use of a mask of CVD-SiO$_2$ film thereby providing the p-diffusion region 28. In this occasion, if ZnAs$_2$ is used as a diffusion source, Zn is penetrated in its depth by 1.2 $\mu$m thereby resulting in an impurity density of $1 \times 10^{17}$ cm$^{-3}$ in the n-GaAs layer 23 under the condition of a heating temperature and time of 600° C. and 200 minutes. Therefore, the front of the p-diffusion region 28 reaches certainly the $p^+$-GaAs layer 22 in a case where the n-GaAs layer is subject to a diffusion under the condition as described above. Thirdly, the anode electrode 27 and the p-gate electrode 29 are provided on a top surface of the p-GaAs layer 25 which is not etched and the p-diffusion region 28 respectively by an alloy of Au/Cr/AuZn. Fourthly, the n-gate electrode 30 is provided on the n-GaAs layer 23 which is on the opposite side of the p-diffusion region 28 in regard to the n-GaAs layer 23 which is not etched by an alloy of Auge-Ni. Finally, the wafer is removed on the back surface to be 100 $\mu$m in its thickness thereby providing a better handling property and is provided with the cathode electrode 26 on the back surface by an alloy of AuGe-Ni. A heat treatment of the cathode electrode 26 and the n-gate electrode 30 are performed simultaneously.

In operation, when trigger light is supplied to the gated p-n-p-n device under the condition that a predetermined biased voltage is applied thereto, the gated p-n-p-n device is switched on from OFF state to ON state. Under the ON state, if a band structure of the gated p n-p-n device is made to be the same as that of a double heterostructure which is used in a semiconductor laser or light emitting diode, light can be emitted therefrom. Light sensitivity of the OFF state and light emitting efficiency of the ON state are improved because the p-gate region is depleted to produce the p-n-p-n structure as illustrated in FIG. 2 which is basically considered to a p-n-p-n device. In order to drive the gated p-n-p-n device thereby emitting light therefrom, the p-n-p-n device has to be rapidly turned off. For the purpose of switching off from ON state to OFF state, excess carriers must be expelled rapidly from the three p-n junctions which are forward-biased as described before.

Figure 3:
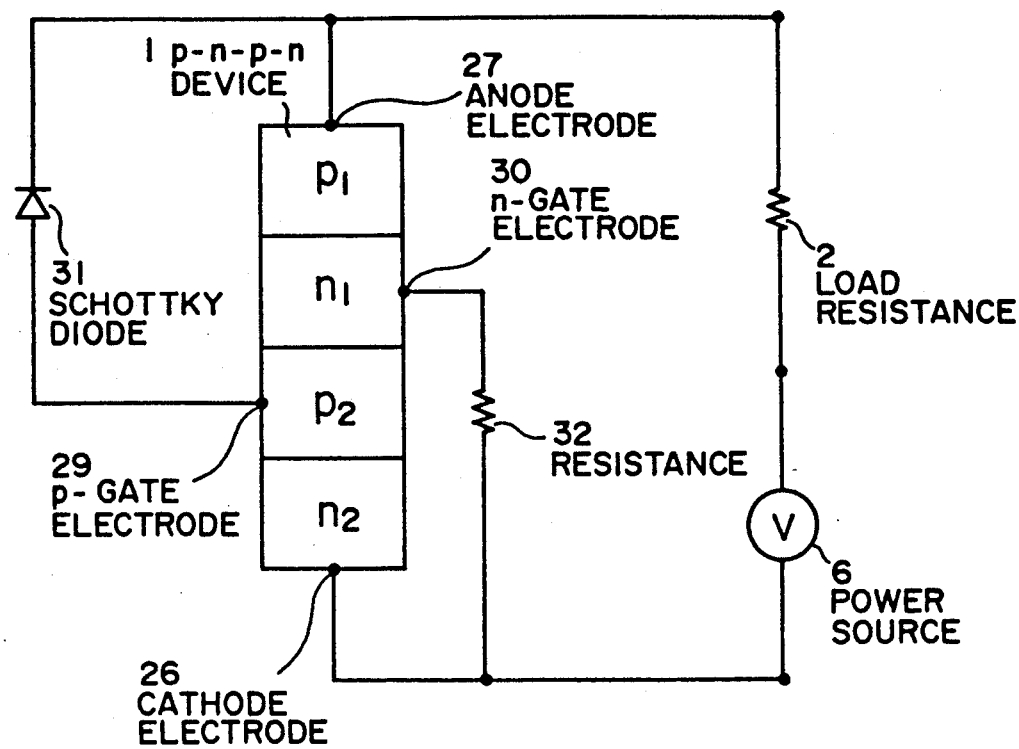
FIGS. 3 to 8 are circuit diagrams showing circuits for driving a p-n-p-n device in a first to sixth embodiments according to the invention.

In FIG. 3, there is shown a circuit for driving a gated p-n-p-n device in a first embodiment according to the invention. The gated p-n p-n device 1 includes a first and second p-layers $p_1$ and $p_2$, a first and second n-layers $n_1$ and $n_2$, a cathode electrode 26 provided on the back surface of the second n-layer $n_2$, an anode electrode 27 provided on the first p-layer $p_1$, a p-gate electrode 29 provided on the second p-layer $p_2$, and an n-gate electrode 30 provided on the first n-layer $n_1$. As understood from the illustrations in FIGS. 2 and 3, the first and second p-layers $p_1$ and $p_2$ correspond to the p-$Al_{0.4}Ga_{0.6}As$ layer 24 and p-diffusion region 28, and the first and second n-layers $n_1$ and $n_2$ correspond to the n-GaAs layer 23 and n-GaAs substrate 20. Across the anode and cathode electrodes 27 and 26, a predetermined polarity and level of a voltage is applied through a load resistance 2 from a power source 6 for driving the p-n-p n device 1. Further, a resistance 32 of, for instance, 10K$\Omega$ is provided between the n-gate and cathode electrodes 30 and 26 of the p-n-p-n device 1, and a schottky diode 31 is provided between the anode and p-gate electrodes 27 and 29 so that the anode electrode of the schottky diode 31 is connected to the p-gate electrode 29, while the cathode electrode of the schottky diode 31 is connected to the anode electrode 27.

In operation, when a position voltage is applied from the power source 6 to the anode electrode 27 of the p-n-p-n device 1 and is increased in its level, the p-n-p-n device 1 is turned on. Under the ON state, the schottky diode 31 is reverse-biased so that no current is flowed between the anode and p-gate electrode 27 and 29. The present state is substantially identical to the state in which the gate switch 7 is turned off in the conventional circuit as shown in FIG. 1. As described before, impurity densities of the n and p-gate regions are $1 \times 10^{17}$ cm$^{-3}$ and $1 \times 10^{19}$ cm$^{-3}$ in the p-n-p-n devices 1 respectively so that almost all voltage applied from the power source to the p-n-p-n device 1 is applied across the junction of the first p and n layers $p_1$ and $n_1$. For this reason, only a very low portion of the voltage is applied across the cathode and n-gate electodes 26 and 30 so that a very low level of a voltage is applied to the resistance 32. As a result, electric current which is determined by the voltage and resistance 32 is flowed there-through so that carriers are injected from the n-gate electrode 30 into the first n-layer $n_1$. Consequently, a switching voltage of the p-n-p-n device 1 is controlled in accordance with the resistance 32. In the experimental results, a switching voltage of the p-n-p-n device 1 is 5 V in a case where no resistance is provided between the cathode and n gate electrodes 26 and 30, while the switching voltage is decreased down to 2.5 V in a case where a resistance value of the resistance 32 is 10KΩ. As a matter of course, a p-n-p-n device having a lower switching voltage is easy to be handled in a practical use thereof.

Next, a negative voltage is applied from the power source 6 to the anode electrode 27 of the p-n-p-n device 1 so that the schottky diode 31 is forward-biased between the p-gate and anode electrodes 29 and 27 which is then under a short circuit. As a result, holes accumulated in the second p-layer $p_2$ of the p-n-p-n device 1 are expelled therefrom through the p-gate electrode 29 to the external thereof in accordance with an internal electric field in the three layers $p_1$, $n_1$ and $p_2$ of the p-n-p-n device 1. Further, electrons accumulated in the first n-layer $n_1$ are forcedly expelled therefrom through the n-gate electrode 30 to the external thereof in accordance with an internal electric field in the three layers $n_1$, $p_2$ and $n_2$ of the p-n-p-n device 1. This is substantially identical to an operation in which the gate switch 7 is turned on between the cathode and gate electrodes 10 and 11 of the p-n-p-n device 1 in the conventional circuit as shown in FIG. 1. Therefore, the gated p-n-p-n device 1 is rapidly switched off from ON state to OFF state in FIG. 3. At this time, a major portion of the negative voltage is applied to the p-n junction of the first p and n layers $p_1$ and $n_1$ due to a relation between inpurity densities of the first n-layer $n_1$ and the second p-layer $p_2$. For this reason, an internal voltage in the three layers $n_1$, $p_2$ and $n_2$ is lower than an internal voltage in the three layers $p_1$, $n_1$, and $p_2$. Therefore, the expulsion of carriers can not be sufficiently performed even if a schottky diode is provided between the cathode and n-gate electrodes 26 and 30 so that the schottky diode is used under the condition of a high internal resistance value. In conclusion, it is most effective that rectifying device is connected across the layer $p_1$, $n_1$ and $p_2$ including the n-p junction of the first n and p-layer $n_1$ and $p_1$ to which a high voltage is applied, while a resistance is connected across the layers $n_1$, $p_2$, and $n_2$ to which only a low voltage is applied when a negative voltage is applied from the power source 6 to the anode electrode 27 to turn off the p-n-p-n device 1. For the purpose of expelling carriers sufficiently at the time of "reset (turning off)", the resistance is preferable to be of a resistance value as small as possible. However, the resistance value can not be smaller than a predetermined value because a switching voltage is changed dependent on the resistance value.

In the embodiment, an experiment was performed by using following parameters. A positive voltage of 2.3 V and a negative voltage of −1 V each having a pulse width of 2.5 n sec are applied from the power source 6 through the load resistance 2 of 50Ω to the anode electrode 27 of the p-n-p-n device 1. In the circumstance, a trigger light having a wavelength of 0.78 μm and a light power of 10 pJ per one shot is supplied to the p-n-p-n device 1 in a fixed repetition pattern at the timing of the positive voltage. In observing output light of the p-n-p-n device 1, it was confirmed that the same output light pattern as the input light pattern was obtained, and that excess carriers accumulated in the p-n-p-n device 1 were rapidly expelled therefrom in accordance with the presence of the schottky diode 32 provided between the p-gate and anode electrodes 29 and 27, and the resistance 32 of 10KΩ provided between the p and n-gate electrodes 26 and 30.

As being apparent from the above, the gate resistance 4, gate power source 5 and gate switch 7 provided between the cathode and gate electrodes 10 and 11 in the conventional circuit in FIG. 1 can be replaced by two elements of the schottky diode 31 and resistance 32 in the circuit according to the invention thereby resulting in a simplification of a circuit structure in the invention. In addition, such a disadvantage of the conventional circuit in FIG. 1 that predetermined timings at which the gate switch 7 is turned on and off must be exactly on timings at which a positive and negative voltages are applied to the anode electrode 9 of the p-n-p-n device 1 is overcome in the circuit according to the invention in which there is no necessity of providing such a gate switch.

The above embodiment in which an impurity density of a semiconductor layer for a p-gate region is higher than that of a semiconductor layer for an n-gate region was explained in one example of a circuit for driving a gated p-n-p-n device according to the invention.

Figure 4:
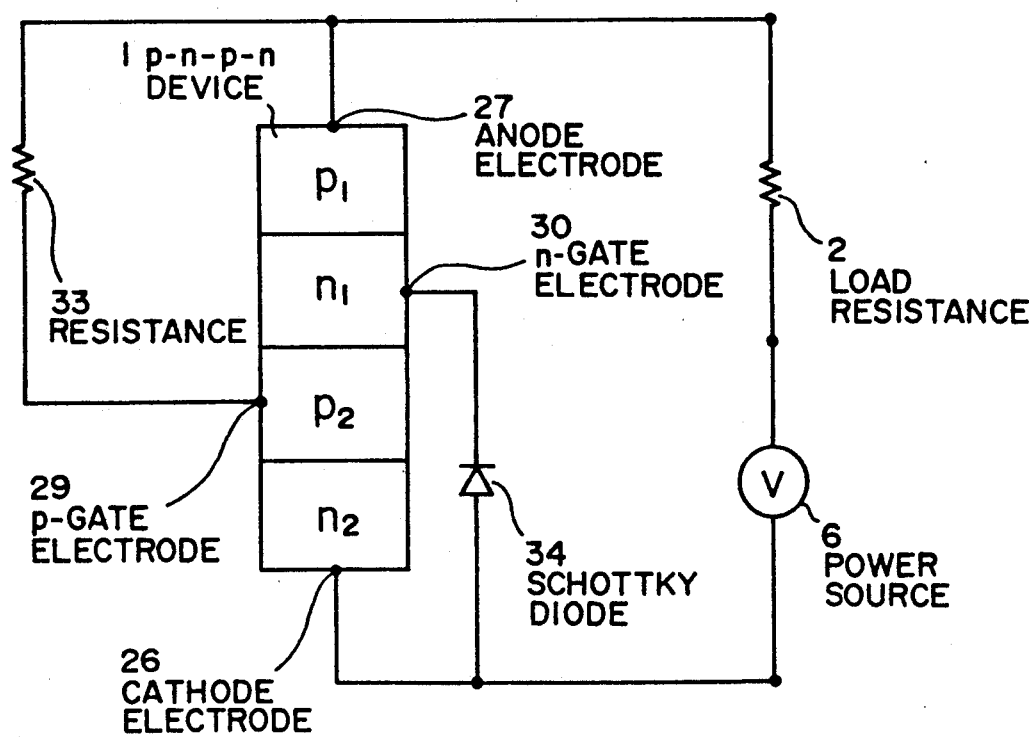

In FIG. 4, there is shown a circuit for driving a gated p-n-p-n device in a second embodiment according to the invention wherein an impurity density of a semiconductor layer for a p-gate region is lower than that of a semiconductor layer for an n-gate region. In the circuit for driving a gated p-n-p-n device, like parts are indicated by like reference numerals in FIG. 3 except that a resistance 33 is provided between the anode and p-gate electrodes 27 and 29, and a schottky diode 34 is provided between the cathode and n-gate electrodes 26 and 30 such that the anode electrode thereof is connected to the cathode electrode 26.

In operation, when a negative voltage is applied from the power source to the anode electrode 27 of the p-n-p-n device 1 which is under ON state, a major portion of the negative voltage is applied to a p-n junction of the cathode and p-gate regions so that carriers are expelled from the second p-layer $p_2$ through the resistance 33 even if a small portion of the negative voltage is applied across the three layers $p_1$, $n_1$ and $p_2$, and from the first n-layer $n_1$ through the schottky diode 34.

In the first and second embodiments, the respective gate electrodes are provided on the p and n-gate regions so that excess carriers are forcedly expelled in a high speed.

In general, the provision of two gate electrodes on a p-n-p-n device results in not only a complication of a construction for the p-n-p-n device, but also the increase of an area thereof. It is known that the accumulation of carriers in p and n-gate regions results in ON state so that the smaller the area is, the less an amount of trigger light is necessary because the accumulation of carriers becomes less in its total amount thereby improving a sensitivity thereof. For these reasons, it must be decided whether two gate electrodes are provided for improving an operation speed from ON to OFF states and vice versa, or a single gate electrode is provided for advantages of a small area and easy fabrication. Following embodiments will be explained in cosideration of the advantages.

Figure 5:
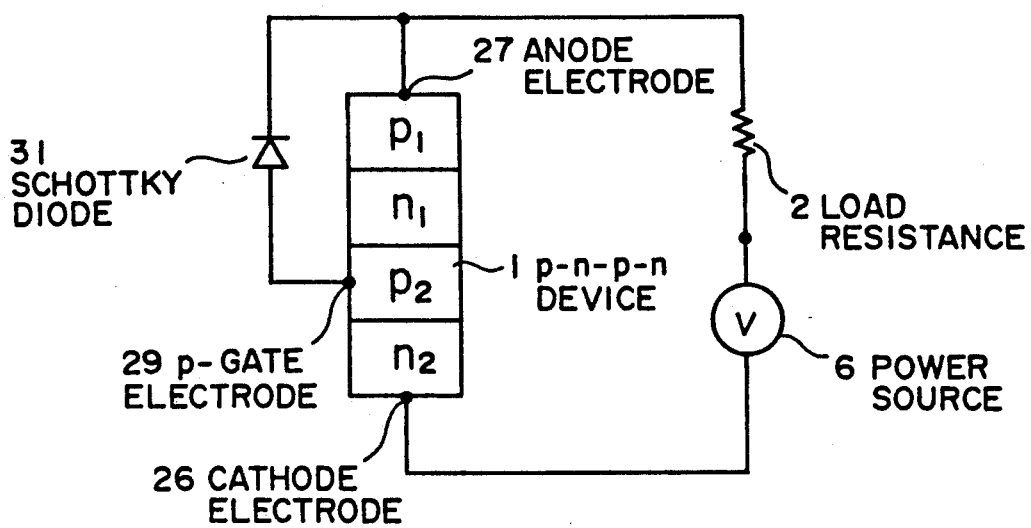

In FIG. 5, there is shown a circuit for driving a gated p-n-p-n device in a third embodiment according to the invention wherein an impurity density of a semiconductor layer for a p-gate region is higher than that of a semiconductor layer of an n-gate region in a gated p-n-p-n device, and a gate electrode is provided only on the p-gate region. In the circuit for driving a gated p-n-p-n device, like parts are indicated by like reference numerals in FIG. 3 except that the resistance 32 is omitted herein.

In operation, the same sequential steps as in the first embodiment are repeated in the third embodiment, provided that there is no injection of carriers through the resistance 32 into the n-gate region under the OFF state so that a switching voltage inherent to the p-n-p-n device 1 is applied thereto because the switching voltage is not controlled due to the omission of the resistance 32. When the p-n-p-n device 1 is shifted from ON state to OFF state, holes accumulated in the second p layer $p_2$ are expelled therefrom through the schottky diode 31 to the external thereof. In accordance with the expulsion of carriers from the second p-layer $p_2$, electrons accumulated in the first n-layer $n_1$ are expelled therefrom. In more detail, the electrons are expelled from the second p-layer $p_2$ to meet a neutralization of charges due to the expulsion of the holes from the second p-layer $p_2$. In fact, a time which was required from ON state to OFF state was longer than that in the first embodiment when the same level of a negative voltage is applid to the p-n-p-n device 1, and actually approximately 4 n sec. As a matter of course, the time can be shortened by increasing a level of the negative voltage.

Figure 6:
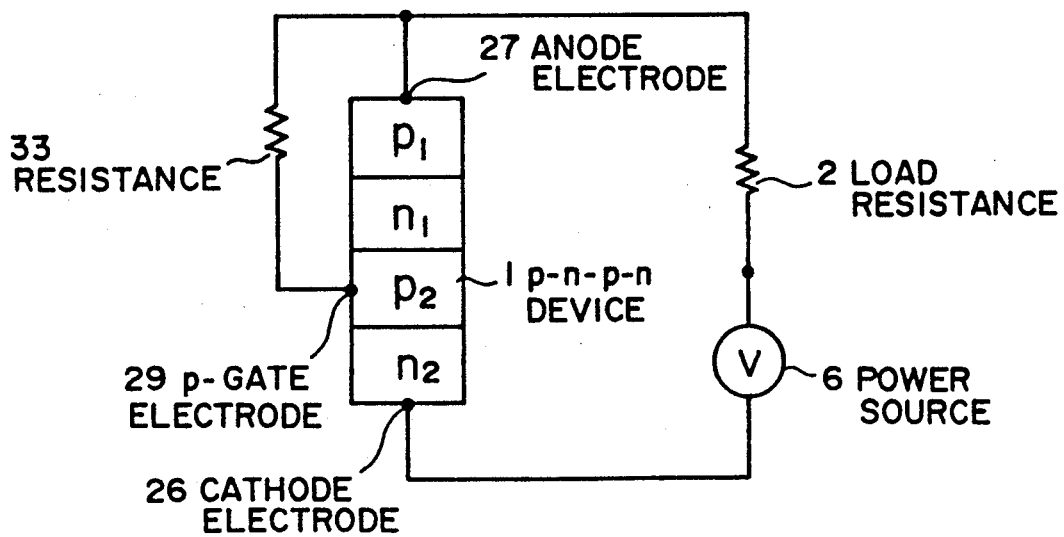

In FIG. 6, there is shown a circuit for driving a gated p-n-p-n device in a fourth embodiment according to the invention wherein an impurity density of a semiconductor layer for a p-gate region is lower than that of a semiconductor layer for an n-gate region in a gated p-n-p-n device, and a gate electrode is provided only on the p-gate region. In the circuit for driving a gated p-n-p-n device, like parts are indicated by like reference numerals in FIG. 4 except that the schottky diode 34 is omitted herein.

In operation, the expulsion of electrons from the first n-layer $n_1$ is less expected than that in the second embodiment because no gate electrode is provided on that layer $n_1$. For this reason, a time which was required from ON state to OFF state was longer than that in the second embodiment when the same level of a negative voltage is applied to the p-n-p-n device 1. The time can be shortened by decreasing a resistance value of the resistance 32, and a switching voltage is thereby decreased because carriers are increased to be injected.

As explained above, a gate electrode is provided on a p-gate region of a gated p-n-p-n device in the third and fourth embodiments. Similarly, a gated p-n-p-n device in which a gate electrode is provided only on an n-gate region will be explained in following embodiments.

Figure 7:
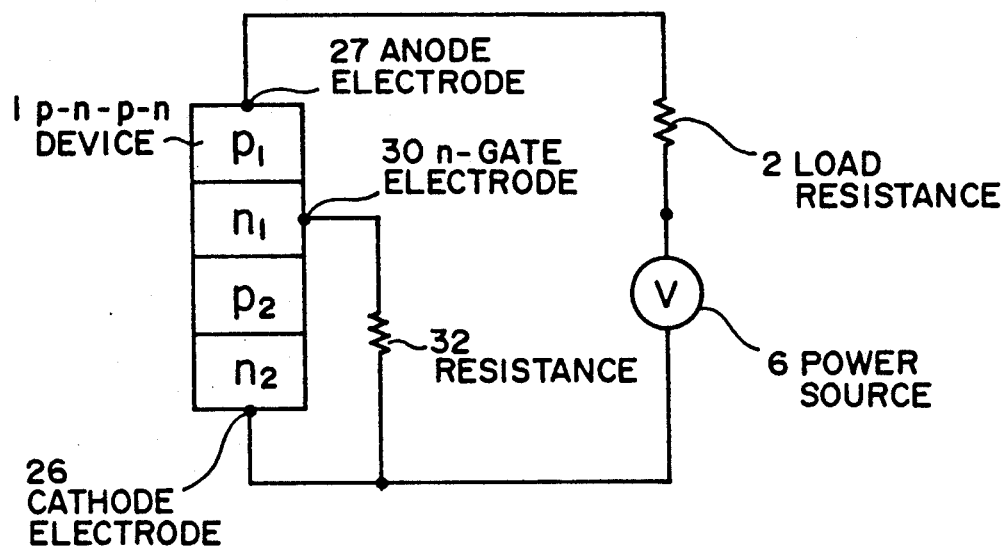

In FIG. 7, there is shown a circuit for driving a gated p-n-p-n device in a fifth embodiment according to the invention wherein an impurity density of a semiconductor layer for a p-gate region is higher than that of a semiconductor layer for an n-gate region in a gated p-n-p-n device, and a gate electrode is provided only on the gate region. In the circuit for driving a gated p n-p-n device, like parts are indicated by like reference numerals in FIG. 3 except that the schottky diode 31 is omitted herein.

Figure 8:
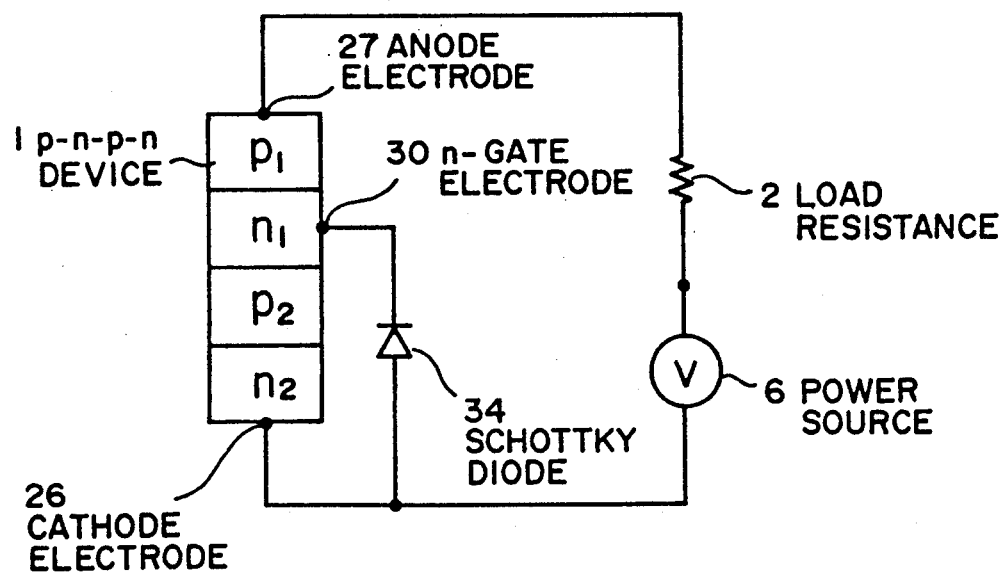

In FIG. 8, there is shown a circuit for driving a gated p-n-p-n device in a sixth embodiment according to the invention wherein an impurity density of a semiconductor layer for a p-gate region is lower than that of a semiconductor layer for a n-gate region in a gated p-n-p-n device, and a gate electrode is provided only on the n-gate region. In the circuit for driving a gated p-n-p-n device, like parts are indicated by like reference numerals in FIG. 4 except that the resistance 33 is omitted herein.

In operation of the fifth and sixth embodiments, a time which was required from ON state to OFF state was longer than that in the first and second embodiments when the same level of a negative voltage is applied to the gated p-n-p-n device 1, and actually 4 n sec.

A circuit for driving a gated p-n-p-n device according to the invention is described above based on a gated p-n-p-n circuit in which a p and n-gate electrodes are provided on a p and n-gate regions, one of the p and n-gate electrodes is provided on a corresponding one of the p and n gate regions, and an impurity density of a semiconductor layer for the p-gate region is higher and lower than that of a semiconductor layer for the n-gate region, and based on a schottky diode and resistance (10KΩ) which are used as a rectifying device and resistor respectively. Further, a p-n-n device in which a p-gate region is depleted in consideration of a high speed operation is used as a p-n-p-n device. However, it should be understood that these are examples in which modification, replacement etc. may be made. For instance, a schottky diode may be replaced by a device having a rectifying characteristic which is an symmetrical current-voltage characteristic to an extent of approximately ±1 V, and a resistance may be replaced by a device having a linear current-voltage characteristic to an extent of approximately ±1 V. Even more, another power source and device may be added to a circuit for driving a gated p-n-p-n device according to the invention.

Although the invention has been described with respect to specific embodiment for complete and clear disclosure, the appended claims are not to thus limited but are to be construed as embodying all modification and alternative constructions that may occur to one skilled in the art which fairly fall within the basic teaching herein set forth.

What is claimed is:

1. A circuit for driving a gated p-n-p-n device comprising,
   a p-n-p-n device in which an impurity density of a semiconductor layer for a p-gate region is higher than that of a semiconductor layer for an n-gate region,
   anode and cathode electrodes respectively provided on anode and cathode regions of said p-n-p-n device,
   a p-gate electrode provided on said p-gate region of said p-n-p-n device,
   a power source means for driving said p-n-p-n device, said power source means being provided in series between said anode and cathode electrodes,
   means having a rectifying property which is provided between said p-gate electrode and said anode electrode, an anode electrode of said means being connected to said p-gate electrode,
   an n-gate electrode provided on said n-gate region of said p-n-p-n device, and
   means having a predetermined resistance value which is provided between said cathode electrode and said n-gate electrode, wherein said means having a predetermined resistance value is a resistor.

2. A circuit for driving a gated p-n-p-n device comprising:

a p-n-p-n device in which an impurity density of a semiconductor layer for a p-gate region is lower than that of semiconductor layer for an n-gate region;

anode and cathode electrodes respectively provided on anode and cathode regions of said p-n-p-n device;

a p-gate electrode provided on said p-gate region of said p-n-p-n device;

a power source means for driving said p-n-p-n device; said power source means being provided in series between said anode and cathode electrodes;

a resistor having a predetermined resistance value which is provided between said p-gate electrode and said anode electrode;

an n-gate electrode provided on said n-gate region of said p-n-p-n device; and means having a rectifying property which is provided between said cathode electrode and said n-gate electrode, an anode electrode of said means being connected to said cathode electrode.

* * * * *

UNITED STATES PATENT AND TRADEMARK OFFICE
CERTIFICATE OF CORRECTION

PATENT NO. : 5,021,694
DATED : June 4, 1991
INVENTOR(S) : Yoshiharu Toshiro et al.

It is certified that error appears in the above-identified patent and that said Letters Patent is hereby corrected as shown below:

Column 4, line 41, delete "p-n-p n", insert --p-n-p-n--.

Column 7, line 62, delete "p n-p-n", insert --p-n-p-n--.

Signed and Sealed this

Fourth Day of May, 1993

Attest:

MICHAEL K. KIRK

Attesting Officer

Acting Commissioner of Patents and Trademarks